United States Patent
Lee et al.

(10) Patent No.: US 9,576,903 B2
(45) Date of Patent: Feb. 21, 2017

(54) STRUCTURE WITH CONDUCTIVE PLUG AND METHOD OF FORMING THE SAME

(71) Applicant: MACRONIX International Co., Ltd., Hsinchu (TW)

(72) Inventors: Ching-Hsiung Lee, Hsinchu (TW); Shih-Chang Tsai, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/801,648

(22) Filed: Jul. 16, 2015

(65) Prior Publication Data
US 2017/0018500 A1    Jan. 19, 2017

(51) Int. Cl.
*H01L 23/48* (2006.01)
*H01L 21/768* (2006.01)
(Continued)

(52) U.S. Cl.
CPC ..... *H01L 23/5283* (2013.01); *H01L 21/76816* (2013.01); *H01L 21/76831* (2013.01); *H01L 21/76843* (2013.01); *H01L 21/76879* (2013.01); *H01L 23/481* (2013.01); *H01L 23/53223* (2013.01); *H01L 23/53238* (2013.01); *H01L 23/53266* (2013.01)

(58) Field of Classification Search
CPC .......... H01L 23/5283; H01L 23/53238; H01L 23/53223; H01L 23/53266; H01L 23/528; H01L 23/481; H01L 21/76816; H01L 21/76831; H01L 21/76843; H01L 21/76877; H01L 21/76897; H01L 21/02063; H01L 21/76802; H01L 21/768; H01L 21/76807; H01L 45/1683; H01L 2221/101; H01L 2221/1015; H01L 2221/1031

See application file for complete search history.

(56) References Cited

U.S. PATENT DOCUMENTS 5,893,752 A * 4/1999 Zhang .............. H01L 21/76807
257/E21.579
6,492,263 B1 * 12/2002 Peng ................ H01L 21/76807
257/E21.579

(Continued)

FOREIGN PATENT DOCUMENTS

TW          463307      11/2001
TW        200534458     10/2005

OTHER PUBLICATIONS

"Office Action of Taiwan Counterpart Application," issued on Jul. 6, 2016, p. 1-p. 4, in which the listed references were cited.

*Primary Examiner* — Galina Yushina
(74) *Attorney, Agent, or Firm* — J.C. Patents

(57) ABSTRACT

Provided is a structure with a conductive plug including a substrate, a first dielectric layer, an etch stop layer, a second dielectric layer, a conductive plug and a liner. The substrate has a conductive region therein. The first dielectric layer, the etch stop layer and the second dielectric layer are sequentially formed on the substrate and have at least one opening therethrough. Besides, the opening has a substantially vertical sidewall. The conductive plug fills in the opening and is electrically connected to the conductive region. The liner surrounds the upper portion of the conductive plug. A method of forming a structure with a conductive plug is further provided.

10 Claims, 4 Drawing Sheets

(51) Int. Cl.
*H01L 23/528* (2006.01)
*H01L 23/532* (2006.01)

(56) References Cited

U.S. PATENT DOCUMENTS

| | | | | |
|---|---|---|---|---|
| 7,224,068 B2 * | 5/2007 | Tseng | ................ | H01L 21/76801 257/758 |
| 2004/0043619 A1 | 3/2004 | Rhodes et al. | | |
| 2007/0155172 A1 * | 7/2007 | Lai | ...................... | H01L 27/2436 438/666 |
| 2009/0243116 A1 * | 10/2009 | Feustel | ............. | H01L 21/76807 257/773 |
| 2015/0076669 A1 * | 3/2015 | Chang | ............... | H01L 21/76804 257/635 |
| 2016/0093566 A1 * | 3/2016 | Ting | .................... | H01L 23/5226 257/774 |
| 2016/0111371 A1 * | 4/2016 | Peng | ................ | H01L 23/53238 257/751 |

\* cited by examiner

STRUCTURE WITH CONDUCTIVE PLUG AND METHOD OF FORMING THE SAME

BACKGROUND OF THE INVENTION

Field of Invention

The present invention relates to a semiconductor device and a method of forming the same, and more particularly to a structure with a conductive plug and a method of forming the same.

Description of Related Art

Along with the development of science and technology, semiconductor devices are required to miniaturize so as to meet the current trends of light, thin, short and small products. However, some process problems emerge as the size of semiconductor devices is scaled down.

For example, when a contact is downsized, the aspect ratio of the contact is increased, and thus, the etching becomes difficult and the process window becomes small. For a contact etching process, undesired profiles such as tapered and/or bowing profiles, rather than desired vertical profiles, are often observed.

SUMMARY OF THE INVENTION

Accordingly, the present invention provides a structure with a conductive plug and a method of forming the same, in which multiple etching block layers can be configured to block the plug opening from being deformed during the opening defining step, so that the plug opening and therefore the conducive plug can be formed with a desired vertical profile.

The present invention provides a structure with a conductive plug including a substrate, a first dielectric layer, an etch stop layer, a second dielectric layer, a conductive plug and a liner. The substrate has a conductive region therein. The first dielectric layer, the etch stop layer and the second dielectric layer are sequentially formed on the substrate. At least one opening penetrates through the first dielectric layer, the etch stop layer and the second dielectric layer and has a substantially vertical sidewall. The conductive plug fills in the opening and is electrically connected to the conductive region. The conductive plug has a side surface and a bottom surface, and the bottom surface of the conductive plug is in direct contact with the conductive region. The liner surrounds the side surface of the conductive plug.

According to an embodiment of the present invention, an aspect ratio of the opening ranges from about 2:1 to 40:1.

According to an embodiment of the present invention, the liner is only disposed between the conductive plug and the second dielectric layer and is in contact with the etch stop layer.

According to an embodiment of the present invention, the etch stop layer includes silicon nitride, silicon oxynitride or a combination thereof.

According to an embodiment of the present invention, the liner includes polysilicon, amorphous silicon, silicon nitride, silicon oxynitride or a combination thereof.

According to an embodiment of the present invention, a thickness ratio of the second dielectric layer to the first dielectric layer is about 1:1 to 20:1.

According to an embodiment of the present invention, a thickness ratio of the first dielectric layer to the etch stop layer is about 2:1 to 10:1.

According to an embodiment of the present invention, a thickness ratio of the etch stop layer to the liner is about 1:1 to 5:1.

According to an embodiment of the present invention, the conductive plug includes a barrier layer disposed on a surface of the opening, and a metal layer filling up the opening.

According to an embodiment of the present invention, the conductive region includes a doped region, a gate or a wire.

The present invention further provides a method of forming a structure with a conductive plug. A substrate is provided with a conductive region therein. A first dielectric layer, an etch stop layer, a second dielectric layer and a hard mask layer are sequentially formed on the substrate, wherein the hard mask layer has at least one opening formed therein. A first etching process is performed by using the hard mask layer as a mask, so as to deepen the opening to the second dielectric layer until a portion of the etch stop layer is exposed. A liner is formed on a sidewall and a bottom of the opening, wherein the liner is in contact with the etch stop layer. A second etching process is performed by using the hard mask layer as a mask, so as to further deepen the opening to the first dielectric layer until a portion of the conductive region is exposed. A conductive plug is filled in the opening.

According to an embodiment of the present invention, the opening upon the second etching process has a substantially vertical sidewall, and an aspect ratio of the opening ranges from about 2:1 to 40:1.

According to an embodiment of the present invention, each of the first etching process and the second etching process includes an anisotropic etching process.

According to an embodiment of the present invention, the step of forming the hard mask layer includes the following steps. A composite photoresist layer is formed on the hard mask layer, wherein the composite photoresist layer has at least one opening pattern therein. The opening pattern of the composite photoresist layer is transferred into the hard mask layer.

According to an embodiment of the present invention, the composite photoresist layer includes a three-layer or four-layer structure.

According to an embodiment of the present invention, after the step of performing the second etching process, a horizontal portion of the liner is removed while a vertical portion of the liner remains.

According to an embodiment of the present invention, the etch stop layer includes silicon nitride, silicon oxynitride or a combination thereof.

According to an embodiment of the present invention, the liner includes polysilicon, amorphous silicon, silicon nitride, silicon oxynitride or a combination thereof.

According to an embodiment of the present invention, the hard mask layer includes polysilicon, amorphous silicon, silicon nitride, silicon oxynitride or a combination thereof.

According to an embodiment of the present invention, the step of filling the conductive plug in the opening includes the following steps. A barrier material layer is formed on a surface of the opening. A metal material layer is formed on the barrier material layer, wherein the metal material layer fills up the opening. Portions of the barrier material layer and the metal material layer outside of the opening are removed.

In view of the above, during the etching process for defining a plug opening, a "horizontal U-shaped" etching block layer (constituted by a horizontal hard mask layer, a vertical liner and a horizontal etch stop layer) is disposed beside the plug opening, so that tapered and/or bowing profiles caused by ion bombardment and/or over-etching during the etching process can be avoided. The plug opening and therefore the conductive plug can be formed with a substantially vertical profile, and the performance of the device can be accordingly improved.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
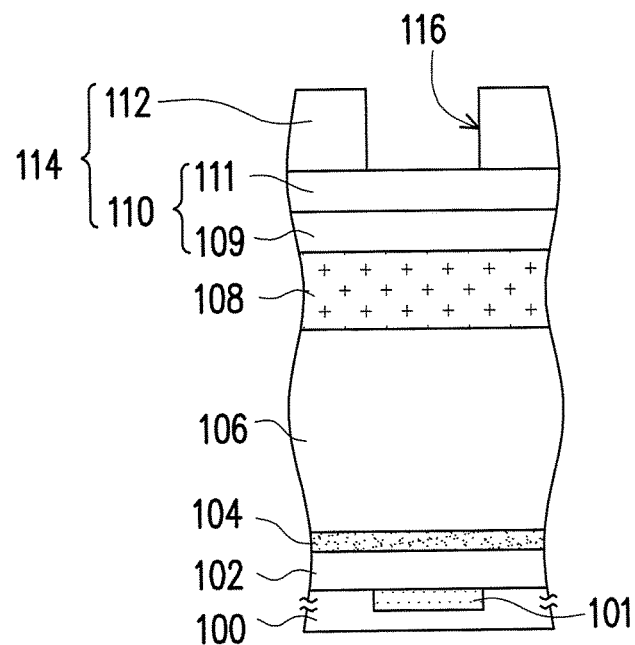
FIG. 1A to FIG. 1H are cross-sectional views of a method of forming a structure with a conductive plug according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1H are cross-sectional views of a method of forming a structure with a conductive plug according to an embodiment of the present invention.

Referring to FIG. 1A, a substrate 100 is provided. The substrate 100 includes a semiconductor material, an insulating layer, a conductive material or a combination thereof. The semiconductor material can be a silicon-containing material. The insulating material can be a dielectric material. The conductive material can be polysilicon, metal or a combination thereof. In an embodiment, the substrate 100 has a conductive region 101 therein. The conductive region 101 includes a doped region, a gate or a wire. In an embodiment, when the conductive region 101 is a doped region, a polysilicon gate or a metal gate, the formed conductive plug can be referred to as a "contact". In another embodiment, when the conductive region 101 is a metal wire, the formed conductive plug can be referred to as a "via".

Thereafter, a first dielectric layer 102, an etch stop layer 104, a second dielectric layer 106 and a hard mask layer 108 are sequentially formed on the substrate 100. Each of the first dielectric layer 102 and the second dielectric layer 106 includes silicon oxide, un-doped silicon glass (USG), fluorinated silica glass (FSG), boro-phosphorous silicate glass (BPSG), boro-silicate glass (BSG), a combination thereof or the like. The method of forming each of the first dielectric layer 102 and the second dielectric layer 106 includes performing a spin coating, a chemical vapour deposition (CVD) process or a suitable method. Besides, the first dielectric layer 102 and the second dielectric layer 106 include the same or different materials.

The etch stop layer 104 includes silicon nitride, silicon oxynitride or a combination thereof, and the forming method thereof includes performing a CVD process. The hard mask layer 108 includes polysilicon, amorphous silicon, silicon nitride, silicon oxynitride or a combination thereof, and the forming method thereof includes performing a CVD process. In an embodiment, the etch stop layer 104 and the hard mask layer 108 include the same material, such as silicon nitride. In another embodiment, the etch stop layer 104 includes a material different from that of the hard mask layer 108.

Besides, the thickness ratio of the second dielectric layer 106 to the first dielectric layer 102 is about 1:1 to 20:1, the thickness ratio of the second dielectric layer 106 to the hard mask layer 108 is about 2:1 to 10:1, and the thickness ratio of the first dielectric layer 102 to the etch stop layer 104 is about 2:1 to 10:1. In an embodiment, the first dielectric layer 102 has a thickness of about 1,000 angstroms, the etch stop layer 104 has a thickness of about 500 angstroms, the second dielectric layer 106 has a thickness of about 4,000 angstroms, and the hard mask layer 108 has a thickness of about 2,000 angstroms.

Afterwards, a composite photoresist layer 114 is formed on the hard mask layer 108, and the composite photoresist layer 114 has at least one opening pattern 116 therein. In an embodiment, the composite photoresist layer 114 includes, from bottom to top, a transfer layer 110 and a photoresist layer 112. The opening pattern 116 is defined in the photoresist layer 112 with a photolithography process. The photoresist layer 112 includes a photosensitive material. The transfer layer 110 can be a single layer or multi-layer structure. The transfer layer 110 includes a dielectric anti-reflection coating (DARC) layer, an amorphous carbon layer, a silicon-rich anti-reflection coating (SHB) layer, an organic dielectric layer (ODL) or a combination thereof. In an embodiment, the transfer layer 110 can be, for example but not limited thereto, a double-layer structure including a lower transfer layer 109 and an upper transfer layer 111, as shown in FIG. 1A. In an embodiment, the composite photoresist layer 114 further includes a bottom anti-reflective coating (BARC) layer located between the photoresist layer 112 and the transfer layer 110.

Specifically, the composite photoresist layer 114 includes a three-layer or four-layer structure. In an embodiment, the composite photoresist layer 114 includes, from bottom to top, an amorphous carbon layer as a lower transfer layer 109, a DARC layer as an upper transfer layer 111, a BARC layer and a photoresist layer 112. In another embodiment, the composite photoresist layer 114 includes, from bottom to top, an ODL as a lower transfer layer 109, a SHB layer as an upper transfer layer 111 and a photoresist layer 112. In yet another embodiment, the composite photoresist layer 114 includes, from bottom to top, an amorphous carbon layer as a lower transfer layer 109, a SHB layer as an upper transfer layer 111 and a photoresist layer 112.

Figure 1B:
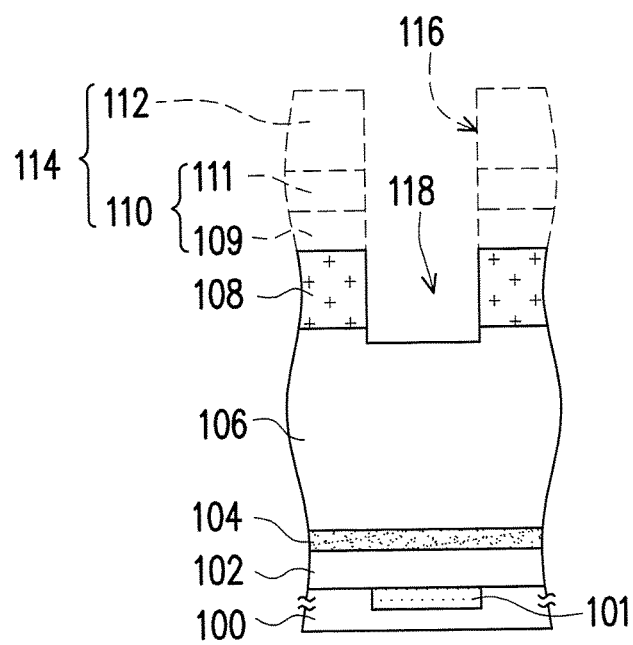

Referring to FIG. 1B, the opening pattern 116 of the composite photoresist layer 114 is transferred into the hard mask layer 108. Specifically, a dry etching process is performed by using the photoresist layer 112 as a mask, so as to sequentially transfer the opening pattern 116 into the transfer layer 110 and the hard mask layer 108, and thus, the hard mask layer 108 has at least one opening 118 formed therein. The composite photoresist layer 114 is then removed.

Figure 1C:
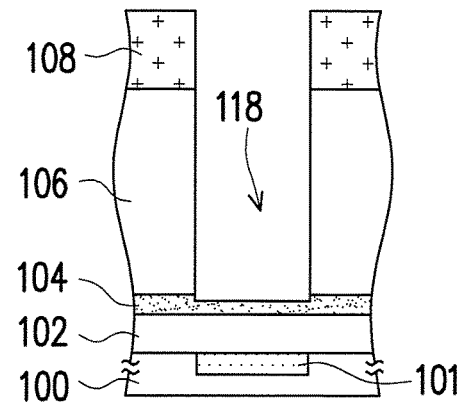

Referring to FIG. 1C, a first etching process E1 is performed by using the hard mask layer 108 as a mask, so as to deepen the opening 118 to the second dielectric layer 106 until a portion of the etch stop layer 104 is exposed. The first etching process E1 includes an anisotropic etching process, such as a dry etching process, by using the etch stop layer 104 as an etching stop layer. In an embodiment, a portion of the etch stop layer 104 is simultaneously removed during the etching process E1.

Figure 1D:
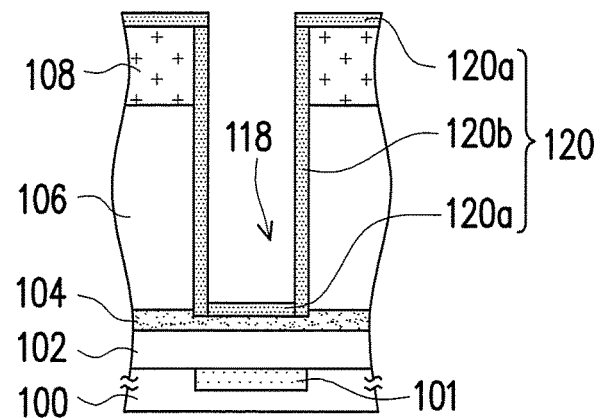

Referring to FIG. 1D, a liner 120 is formed on the top of the hard mask layer 108 and on the sidewall and bottom of the opening 118. Besides, the liner 120 and the etch stop layer 104 are in contact with each other. Specifically, the liner 120 includes a horizontal portion 120a located on the top of the hard mask layer 108 and on the bottom of the opening 118, and a vertical portion 120b located on the sidewall of the opening 118. The liner 120 includes polysilicon, amorphous silicon, silicon nitride, silicon oxynitride or a combination thereof, and the forming method thereof includes performing a CVD process. In an embodiment, the liner 120 and the etch stop layer 104 include the same material, such as silicon nitride. In another embodiment, the liner 120 includes a material different from that of the etch stop layer 104. Besides, the thickness ratio of the etch stop layer 104 to the liner 120 is about 1:1 to 5:1. In an embodiment, the liner 120 has a thickness of about 300 angstroms, and the etch stop layer 104 has a thickness of about 500 angstroms.

The said embodiments in which the material species included in the first dielectric layer 102, the etch stop layer 104, the second dielectric layer 106, the hard mask layer 108 and the liner 120 are provided for illustration purposes, and are not construed as limiting the present invention. People having ordinary skill in the art are appreciated that, any material species is contemplated as falling within the spirit and scope of the present invention as long as the etching selectivity of each of the first dielectric layer 102 and the second dielectric layer 106 to each of the etch stop layer 104, the hard mask layer 108 and the liner 120 is greater than about 5:1.

Figure 1E:
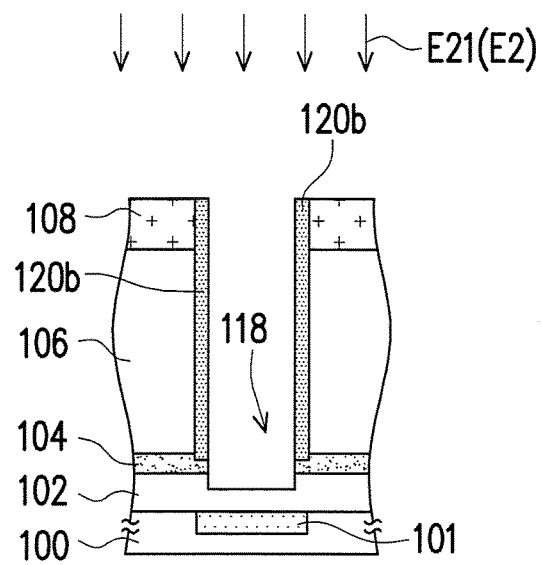
Figure 1F:
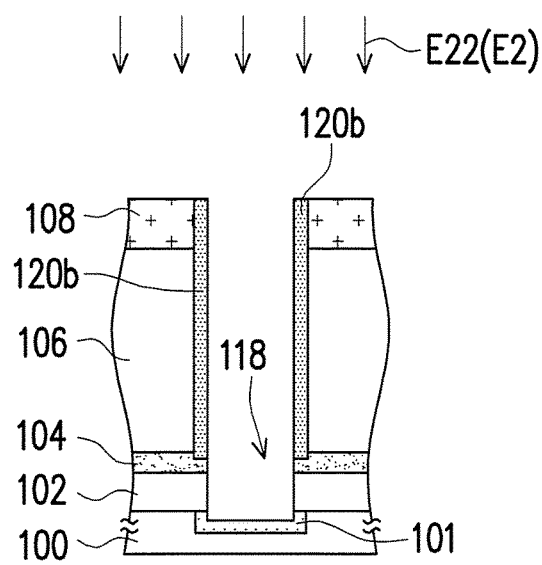

Referring to FIG. 1E and FIG. 1F, a second etching process E2 is performed by using the hard mask layer 108 as a mask, so as to further deepen the opening 118 into first dielectric layer 102 until a portion of the conductive region 101 is exposed. The second etching process E2 can be an anisotropic etching process including multiple sub-steps. In an embodiment, the second etching process E2 includes, for example but not limited to, a first dry etching process E21 and a second dry etching process E22.

Specifically, as shown in FIG. 1E, during the step of performing a first dry etching process E21, the horizontal portion 120a of the liner 120 on the top of the hard mask layer 108 and on the bottom of the opening 118 is removed, while the vertical portion 120b of the liner 120 remains on the sidewall of the opening 118. Besides, the first dry etching process E21 deepens the opening 118 to penetrate through the liner 120 and the etch stop layer 104, and further extend into a portion of the first dielectric layer 102. In an embodiment, upper portions of the hard mask layer 108 and the vertical portion 120b of the liner 120 adjacent to each other are simultaneously removed during the first dry etching process E21.

Afterwards, as shown in FIG. 1F, a second dry etching process E22 is performed by using the hard mask layer 108 as a mask, so the opening 118 is deepened to penetrate through the first dielectric layer 102 until a portion of the conductive region 101 is exposed.

In other words, after the step of performing the second etching process E2, the horizontal portion 120a of the liner 120 is removed while the vertical portion 120b of the liner 120 remains. Besides, the vertical portion 120b of the liner 12 is connected to the etch stop layer 104. In addition, the hard mask layer 108 and the vertical portion 120b of the liner 120 can protect the opening 118 from being deformed or bowing during the ion bombardment of the second etching process E2. Moreover, the opening 118 upon the second etching process E2 has a substantially vertical sidewall, and the aspect ratio thereof ranges from about 2:1 to 40:1, e.g. 6:1 to 40:1, 2:1 to 20:1, 3:1 to 20:1 or 2:1 to 12:1.

Figure 1G:
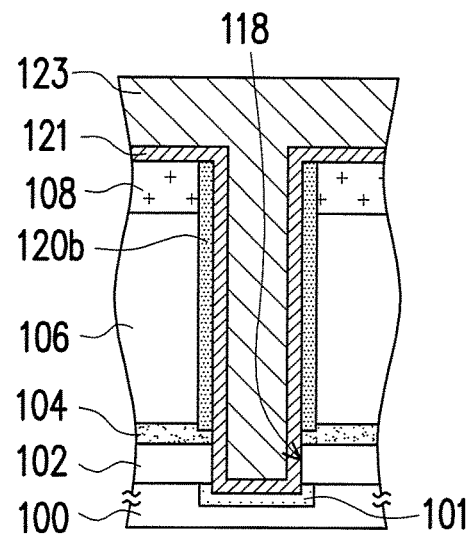
Figure 1H:
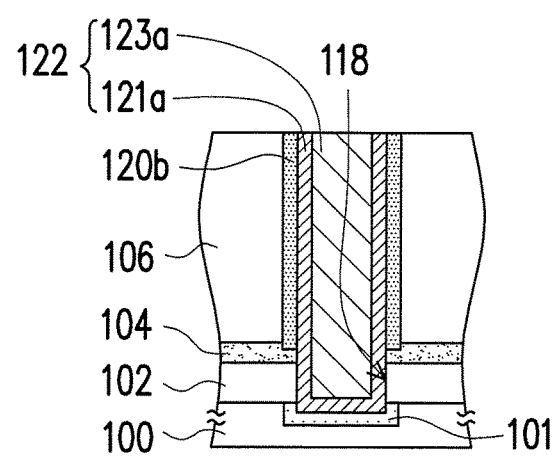

Referring to FIG. 1G and FIG. 1H, a conductive plug 122 is filled in the opening 118. In an embodiment, the conductive plug 122 includes a barrier layer 121a and a metal layer 123a. Specifically, as shown in FIG. 1G, a barrier material layer 121 is formed on the top of the hard mask layer 108 and on the surface of the opening 118. The barrier material layer 121 includes Ti, TiN, Ta, TaN or a combination thereof, and the forming method thereof includes performing a CVD process. Afterwards, a metal material layer 123 is formed on the barrier material layer 121 filling up the opening 118. The metal material layer 123 includes W, Al, Cu or an alloy thereof, and the forming method thereof includes performing a CVD process or an electroplating process. In an embodiment, the step of forming the metal material layer 123 can be omitted upon the process requirements.

Thereafter, as shown in FIG. 1H, portions of the barrier material layer 121 and the metal material layer 123 outside of the opening 118 are removed, and thus, a barrier layer 121a and a metal layer 123a are retained in the opening 118. The removing step includes performing a chemical mechanical polishing (CMP) process. In an embodiment, the hard mask layer 108 is simultaneously removed during the said CMP process. The fabrication of the structure with a conductive plug of the invention is thus completed.

The conductive plug structure of the present invention is illustrated below with reference to FIG. 1H. As shown in FIG. 1H, the structure with a conductive plug of the invention includes a substrate 100, a first dielectric layer 102, an etch stop layer 104, a second dielectric layer 106, a conductive plug 122 and a liner (i.e. the vertical portion 120b thereof). The substrate 100 has a conductive region 101 therein. The first dielectric layer 102, the etch stop layer 104 and the second dielectric layer 106 are sequentially disposed on the substrate 100, wherein at least one opening 118 penetrates through the first dielectric layer 102, the etch stop layer 104 and the second dielectric layer 106. Besides, the opening 118 has a substantially vertical sidewall. Specifically, the inclined angle between the bottom and the sidewall of the opening 118 ranges from about 85 degrees to 95 degrees, such as about 90 degrees. The conductive plug 122 has a substantially vertical sidewall, fills in the opening 118 and is electrically connected to the conductive region 101. In an embodiment, the conductive plug 122 has a side surface and a bottom surface, and the bottom surface of the conductive plug 122 is in direct contact with the conductive region 101. In an embodiment, the conductive plug 122 includes a barrier layer 121a located on the surface of the opening 118 and a metal layer 123a filling up the opening 118.

Besides, the liner (i.e. the vertical portion 120b thereof) is located outside of the opening 118 and surrounds the side surface or the upper portion of the conductive plug 122. In an embodiment, the liner (i.e. the vertical portion 120b thereof) is only disposed between the conductive plug 122 and the second dielectric layer 106. In addition, the liner (i.e. the vertical portion 120b thereof) and the etch stop layer 104 contact with each other and together form an "L-shaped" etching block layer.

In the said embodiments, the conductive plug is formed with a substantially vertical profile, and the liner (i.e. the vertical portion 120b thereof) is an insulating liner configured to surround the upper portion of the conductive plug 122. However, the present invention is not limited thereto. In another embodiment, the liner can be a conductive liner (the material thereof includes doped polysilicon, doped amorphous silicon or the like), so this liner and the conductive plug 122 are electrically connected to each other, and together form a conductive plug with wide top and narrow bottom.

It is noted that, during the etching process for defining the opening 118, a "horizontal U-shaped" etching block layer (constituted by the hard mask layer 108, the vertical portion 120*b* of the liner and the etch stop layer 104, as shown in FIG. 1F) is disposed beside the opening 118, so that tapered and/or bowing profiles caused by ion bombardment and/or over-etching during the etching process can be avoided. Therefore, even though the aspect ratio of the opening 118 is up to about 6:1 to 40:1, the opening 118 can be formed with a substantially vertical sidewall by the method of the invention. In an embodiment, the "horizontal U-shaped" etching block layer is made by the same material such as silicon nitride, but the invention is not limited thereto.

In summary, in the present invention, during the etching process for defining a plug opening, a "horizontal U-shaped" etching block layer is disposed around the plug opening, so as to prevent the opening deformation from being generated by ion bombardment and/or over-etching, and therefore form a plug opening having a substantially vertical sidewall. In such manner, the resulting conductive plug can be formed with a vertical profile and has an "L-shaped" etching block layer therearound. With the method of the invention, the high-aspect-ratio conductive plug is provided with a substantially vertical profile, so the resistance uniformity control for such conductive plug can be easily achieved.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A structure with a conductive plug, comprising:
a substrate, having a conductive region therein;
a first dielectric layer, an etch stop layer and a second dielectric layer, sequentially disposed on the substrate, wherein a portion of the first dielectric layer and a portion of the etch stop layer are disposed on the conductive region, wherein at least one opening penetrates through the first dielectric layer, the etch stop layer and the second dielectric layer;
a conductive plug, filling in the opening and electrically connected to the conductive region, wherein the conductive plug has a side surface and a bottom surface, and the bottom surface of the conductive plug is in direct contact with the conductive region; and
a liner, disposed on the etch stop layer and surrounding a portion of the side surface of the conductive plug.

2. The structure of claim 1, wherein an aspect ratio of the opening ranges from about 2:1 to 40:1.

3. The structure of claim 1, wherein the liner is only disposed between the conductive plug and the second dielectric layer and is in contact with the etch stop layer.

4. The structure of claim 1, wherein the etch stop layer comprises silicon nitride, silicon oxynitride or a combination thereof.

5. The structure of claim 1, wherein the liner comprises polysilicon, amorphous silicon, silicon nitride, silicon oxynitride or a combination thereof.

6. The structure of claim 1, wherein a thickness ratio of the second dielectric layer to the first dielectric layer is about 1:1 to 20:1.

7. The structure of claim 1, wherein a thickness ratio of the first dielectric layer to the etch stop layer is about 2:1 to 10:1.

8. The structure of claim 1, wherein a thickness ratio of the etch stop layer to the liner is about 5:3 to 5:1.

9. The structure of claim 1, wherein the conductive plug comprises:
a barrier layer, disposed on a surface of the opening; and
a metal layer, filling up the opening.

10. The structure of claim 1, wherein the conductive region comprises a doped region, a gate or a wire.

* * * * *